United States Patent
Lo et al.

(10) Patent No.: US 9,073,750 B2
(45) Date of Patent: Jul. 7, 2015

(54) MANUFACTURING METHOD OF MICRO-ELECTRO-MECHANICAL SYSTEM DEVICE AND MICRO-ELECTRO-MECHANICAL SYSTEM DEVICE MADE THEREBY

(71) Applicants: Chiung-Cheng Lo, HsinChu (TW); Kuan-Lin Chen, HsinChu (TW)

(72) Inventors: Chiung-Cheng Lo, HsinChu (TW); Kuan-Lin Chen, HsinChu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 14/459,646

(22) Filed: Aug. 14, 2014

(65) Prior Publication Data

US 2015/0056733 A1 Feb. 26, 2015

Related U.S. Application Data

(60) Provisional application No. 61/868,418, filed on Aug. 21, 2013.

(51) Int. Cl.
*H01L 21/00* (2006.01)
*B81C 1/00* (2006.01)

(52) U.S. Cl.
CPC ........... *B81C 1/0069* (2013.01); *B81C 1/00238* (2013.01); *B81C 1/00269* (2013.01); *B81C 1/00444* (2013.01); *B81C 2203/0109* (2013.01); *B81C 2203/0792* (2013.01)

(58) Field of Classification Search
USPC .......................................... 438/51
See application file for complete search history.

(56) References Cited

U.S. PATENT DOCUMENTS

2012/0248615 A1* 10/2012 Chien et al. .................... 257/770
2013/0334621 A1* 12/2013 Classen et al. ................. 257/415

* cited by examiner

*Primary Examiner* — Asok K Sarkar
(74) *Attorney, Agent, or Firm* — Tung & Associates

(57) ABSTRACT

The invention provides a manufacturing method of a MEMS device, which includes: providing an integrated circuit device including a substrate and an electrical structure on the substrate, the electrical structure includes at least one sensing region and at least one first connection section; providing a structure layer, and forming at least one second connection section on the structure layer; bonding the at least one first connection section and the at least one second connection section; etching the structure layer for forming at least one movable structure, the movable structure being located at a position corresponding to a position of the sensing region, and the movable structure being connected to the at least one first connection section via the at least one second connection section; and thereafter, providing a cap to cover the movable structure and the sensing region, wherein the movable structure is not directly connected to the cap.

10 Claims, 7 Drawing Sheets

MANUFACTURING METHOD OF MICRO-ELECTRO-MECHANICAL SYSTEM DEVICE AND MICRO-ELECTRO-MECHANICAL SYSTEM DEVICE MADE THEREBY

CROSS REFERENCE

The present invention claims priority to U.S. 61/868,418, filed on Aug. 21, 2013.

BACKGROUND OF THE INVENTION

1. Field of Invention

The present invention relates to a manufacturing method of micro-electro-mechanical system (MEMS) device, especially a manufacturing method including: first providing a structure layer to connect a substrate, and afterward providing a cap to cover the structure layer and a portion of the substrate such that a movable structure is not connected to the cap for improving sensing stability, and a MEMS device made thereby.

2. Description of Related Art

MEMS devices are often used for sensing motion or pressure, such as acceleration sensors, gyroscopes, altitude sensors, etc. A MEMS device includes a micro-electro-mechanical device in cooperation with an integrated circuit. There are three approaches to integrate a micro-electro-mechanical device and an integrated circuit: two-chip solution, CMOS-MEMS solution, and wafer-level integration solution.

FIG. 1 shows a MEMS device 10 according to the two-chip solution. A micro-electro-mechanical device chip 11 and an integrated IC chip 12 are separately packaged into chips and wire-bonded for signal transmission (as illustrated by the solid dots in figure). The two-chip solution has an advantage that the manufacturing process is simple, because the micro-electro-mechanical device chip 11 and the integrated circuit chip 12 are separately manufactured and packaged; however, the two-chip solution has a drawback that the separate packages require related pads and pins which increase the cost and consume a larger area. Further, the two-chip solution has another drawback that the wire bond may generate parasitic effects (such as parasitic capacitances formed by the pads), resulting in noises, and the parasitic effects may further influence other electrical behaviors of the MEMS device 10. The problem is that the the parasitic capacitances and the change of these in operation can not be accurately predicted in the design stage for the micro-electro-mechanical device chip 11 and the integrated circuit 12, and can not be accurately compensated in manufacturing the chips; therefore, the sensing performance of this solution is less accurate.

FIG. 2 shows a MEMS device 20 according to the CMOS-MEMS solution. A micro-electro-mechanical device 21 and an integrated circuit 22 are manufactured on one semiconductor wafer but located at different positions. FIG. 2 shows an example that the micro-electro-mechanical device 21 and the integrated circuit 22 are located at two different regions on one same plane; there are other examples (not shown) wherein the micro-electro-mechanical device 21 and the integrated circuit 22 are processed in series. This solution has a drawback that the manufacturing process is more complicated because the micro-electro-mechanical device 21 and the integrated circuit 22 have different requirements. For example, the stack of metal interconnections and isolation layers in manufacturing the integrated circuit 22 may cause a structure distortion in the micro-electro-mechanical device 21 because of different thermal expansion coefficients of different layers, leading to non-ideality effect on signal distortion and large performance shift caused by temperature change. Because the micro-electro-mechanical device 21 and the integrated circuit are manufactured on a same wafer, the process of micro-electro-mechanical device 21 could limit the selection of the integrated circuit 22. For example, the integrated circuit 22 could be improved by selecting more advance technology, but the micro-electro-mechanical device 21 does not. Thus, this type of integration cannot provide the state of art performance due to the different requirements regarding the mechanical and electrical characteristics.

FIGS. 3 and 4 show a MEMS device 30 according to the wafer-level integration solution. The micro-electro-mechanical device and the integrated circuit are separately manufactured in different wafers and afterward bonded in wafer form, whereby a micro-electro-mechanical device 31 is stacked on an integrated circuit device 32, and the stack structure of the micro-electro-mechanical device 31 and the integrated circuit device 32 is singulated from the stacked wafers and packaged into a MEMS device chip. As shown in FIG. 3, the micro-electro-mechanical device 31 and the integrated circuit device 32 have respectively finished their own manufacturing processes, wherein the micro-electro-mechanical device 31 includes a movable structure 312, a cap 313, and a connection section 314 for connecting the movable structure 312 and the cap 313 (the location of the connection section 314 is for illustrative purpose and not limited to the location as shown in figure). The integrated circuit device 32 includes a substrate 321, a circuit layout (not shown), signal contacts 322 for connection to the micro-electro-mechanical device 31, and a bond pad 323 for external communication. If necessary, a chamber 324 can be formed to provide a working space for the motion of the micro-electro-mechanical device 31. In FIG. 4, the micro-electro-mechanical device 31 and the integrated circuit device 32 are bonded to each other, and the bond pad 323 can be exposed by etching the micro-electro-mechanical device 31 (related step not shown).

The prior art shown in FIGS. 3-4 has the following drawback. To manufacture the micro-electro-mechanical device 31 in the semi-finished state as shown, the movable structure 312 which is suspending needs to be connected to a fixed part, so the movable structure 312 must be connected to the cap 313. However, a pressure is laid on the cap 313 when the micro-electro-mechanical device 31 is bonded with the integrated circuit device 32, and the molding step in the packaging process and the mounting step of the MEMS device on a circuit board will also cause the cap 313 to be stressed. Because the cap 313 is connected to the movable structure 312, the stressed cap 313 will influence the structure and motion of the movable structure 312 to cause inaccuracy, and this inaccuracy cannot be predicted and compensated in the design stage or in the manufacturing process of the micro-electro-mechanical device 31 and the integrated circuit device 32.

SUMMARY OF THE INVENTION

In one perspective, the present invention provides a manufacturing method of a MEMS device, including: providing an integrated circuit device including a substrate and an electrical structure on the substrate, wherein the electrical structure includes at least one sensing region and at least one first connection section; providing a structure layer, and forming at least one second connection section on the structure layer; bonding the at least one first connection section with the at least one second connection section; etching the structure layer to form at least one movable structure, the movable structure being located at a position corresponding to a position of the sensing region, and the movable structure being connected to the at least one first connection section via the at least one second connection section; and thereafter, providing a cap to cover the movable structure and the sensing region; wherein the movable structure is not directly connected to the cap.

In one embodiment of the present invention, the cap is connected to the electrical structure. In another embodiment, the cap is connected to a portion of the structure layer which is not the movable structure.

In one embodiment, the first connection section and the second connection section are bonded by eutectic bonding or fusion.

In one embodiment of the present invention, the step of forming at least one second connection section on the structure layer comprises: etching the structure layer to form at least one stand-off and coating an adhesive on the stand-off.

In one embodiment, the adhesive includes: aluminum, titanium, germanium, gold, a mixture of two or more of the above elements, or a compound containing one of the above elements.

In another embodiment, the movable structure is a membrane or a cantilever beam, or includes a proof mass and a spring connected to the proof mass.

In another embodiment, the manufacturing method further includes grinding the structure layer to reduce a thickness of the structure layer.

In one embodiment of the present invention, the manufacturing method further includes etching the cap to form a recess for forming a working space in the MEMS device.

In another perspective, the present invention provides a MEMS device made by one of the aforementioned methods, the MEMS device includes the integrated circuit device and a micro-electro-mechanical device, wherein the micro-electro-mechanical device includes the structure layer and the cap.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, but not drawn according to actual scale. The orientation wordings in the description such as: above, under, left, or right are for reference with respect to the drawings, but not for limiting the actual product made according to the present invention.

Figure 6:
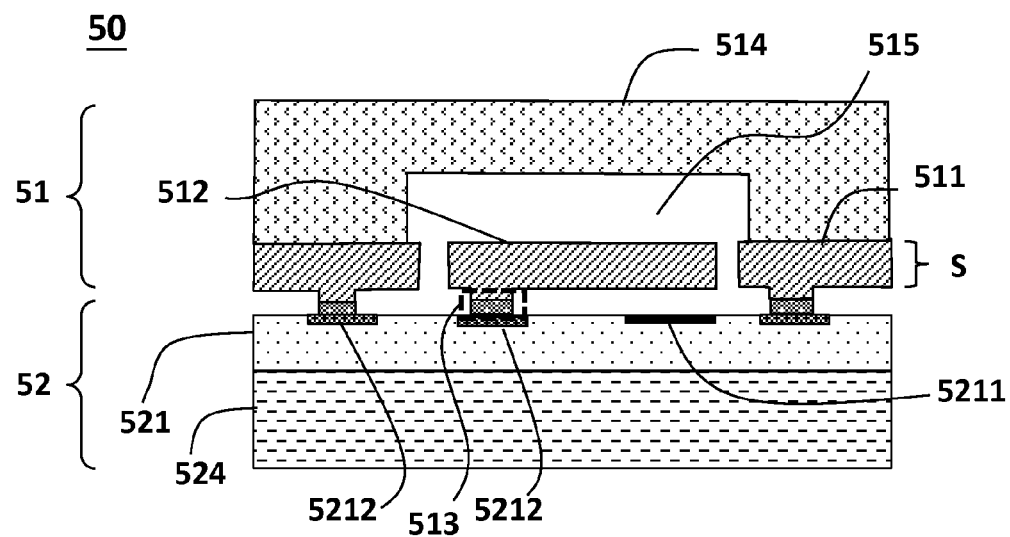
FIG. 6 shows a MEMS device according to an embodiment of the present invention.

FIG. 6 shows a MEMS device 50 according to a perspective of the present invention. The MEMS device 50 includes a micro-electro-mechanical device 51 coupled with an integrated circuit device 52. The micro-electro-mechanical device 51 includes a structure layer S and a cap 514, wherein the structure layer S includes a connection region 511 connected to the cap 514, at least one movable structure 512, and at least one connection section 513 connected to the integrated circuit 52. A working space 515 is formed between the structure layer S and the cap 514; the working space 515 can be a sealed space or a non-sealed space depending on the design of the MEMS device 50. The integrated circuit device 52 includes a substrate 524 and an electrical structure 521 on the substrate 524 (the electrical structure 521 has insulation portions therein which is not shown in figure). The electrical structure 521 includes at least one sensing region 5211 and at least one connection section 5212. The sensing region 5211 is located at a location corresponding to the movable structure 512 for sensing the motion of the movable structure to generate a sensing signal and transmitting the sensing signal to a circuit (not shown) in the integrated circuit device 52. The connection section 5212 is for connecting to the corresponding connection section 513 of the micro-electro-mechanical device 51. In this embodiment, the movable structure 512 for example can be but is not limited to a membrane or a cantilever beam.

Figure 1:
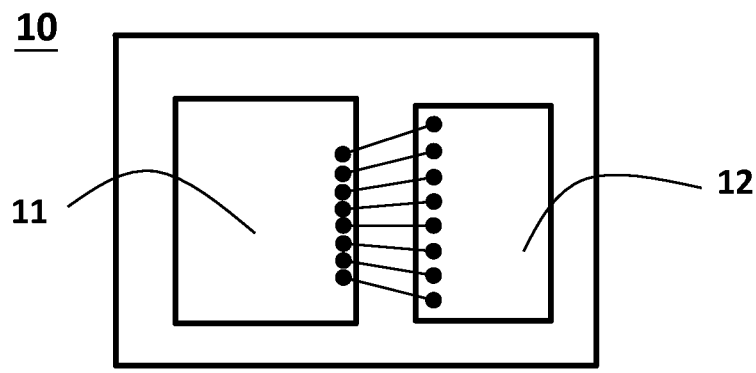
FIG. 1 shows the prior art two-chip solution.
Figure 2:
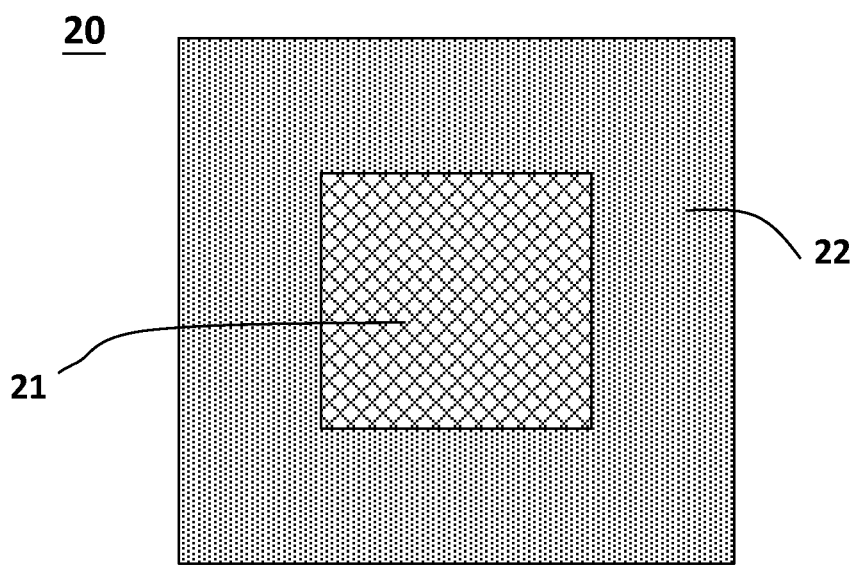
FIG. 2 shows the prior art CMOS-MEMS solution.
Figure 3:
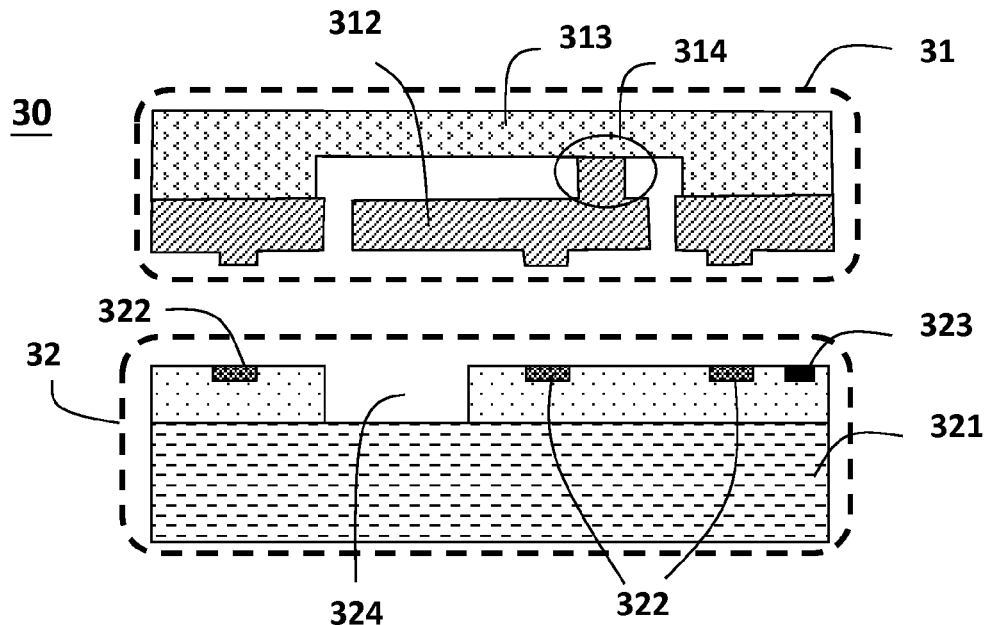
FIGS. 3-4 show the prior art wafer level integration solution.
Figure 4:
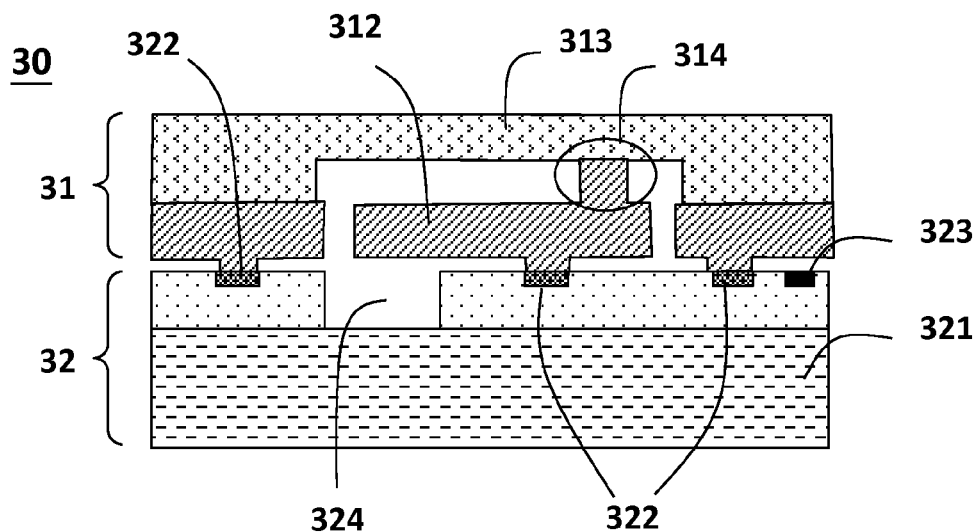

In comparison with the prior art of FIGS. 3 and 4, the movable structure 512 in the MEMS device of the present invention is not directly connected to the cap 514; therefore, the motion of the movable structure 512 is not influenced by the cap 514 and the sensing result will not deviate, even though the cap 514 may need to receive high pressure or high temperature. That "the movable structure 512 is directly connected to the cap 514" means that the movable structure 512 is connected to the cap 514 via any component/portion of the micro-electro-mechanical device 51; that "the movable structure 512 is not directly connected to the cap 514" means that the movable structure 512 is not connected to the cap 514 via any component/portion of the micro-electro-mechanical device 51, but the movable structure 512 can be indirectly connected to the cap 514 via the integrated circuit 52.

Figure 5A:
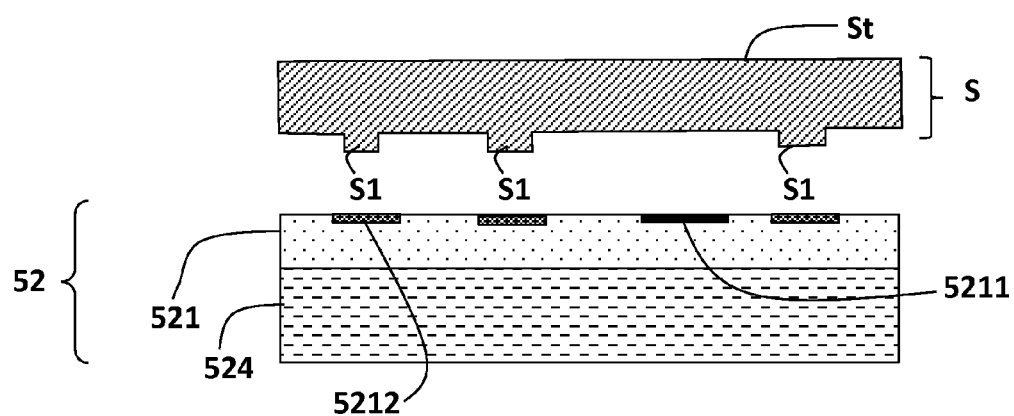
FIGS. 5A-5F show a manufacturing method of a MEMS device according to an embodiment of the present invention.

In order for the movable structure 512 not to be directly connected to the cap 514, the present invention discloses a different manufacturing method from the prior art of FIGS. 3 and 4. FIGS. 5A-5F show a manufacturing method of the MEMS 50 disclosed by the present invention. Referring to FIG. 5A, the integrated circuit device 52 is manufactured on an integrated circuit wafer by a semiconductor process, wherein the integrated circuit device 52 includes the aforementioned substrate 524 and the electrical structure 521 on the substrate 524. The electrical structure 521 includes at least one sensing region 5211 and at least one connection section 5212. While the integrated circuit 52 is manufactured or at a different time, a structure layer S, and stand-offs S1 are manufactured on one side of the structure layer S, by for example but not limited to etching. If the thickness of the structure layer S is too thick (for example, when the structure layer S is made of a silicon substrate), a grinding process can be performed to grind an opposite side (hereafter top surface) of the structure layer S to reduce the thickness. The grinding process can be performed later as an alternative.

Figure 5B:
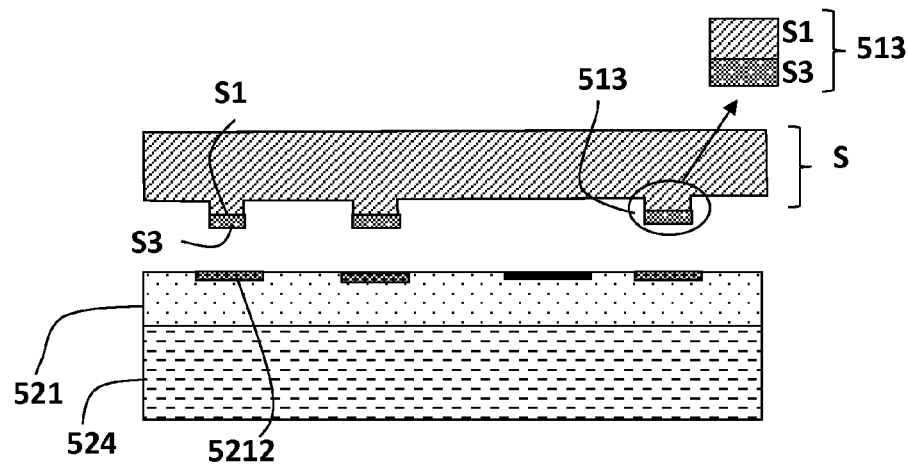

Referring to FIG. 5B, the stand-offs S1 are coated with an adhesive S3. According to the present invention, the mechanical and electrical connections between the micro-electro-mechanical device 51 and the integrated circuit 52 are achieved by the bonding which includes eutectic bonding, solder bonding, thermocompression or fusion. For example, the bonding can be bonding which includes materials such as aluminum, titanium, germanium, gold, tin, or a mixture of two or more of the above elements, or a compound containing one of the above elements. However, the present invention is not limited to eutectic bonding; the connection can be achieved by other methods, such as by fusion. The stand-offs S1 and adhesive S3 together form the connection section 513 of the micro-electro-mechanical device 51.

Figure 5C:
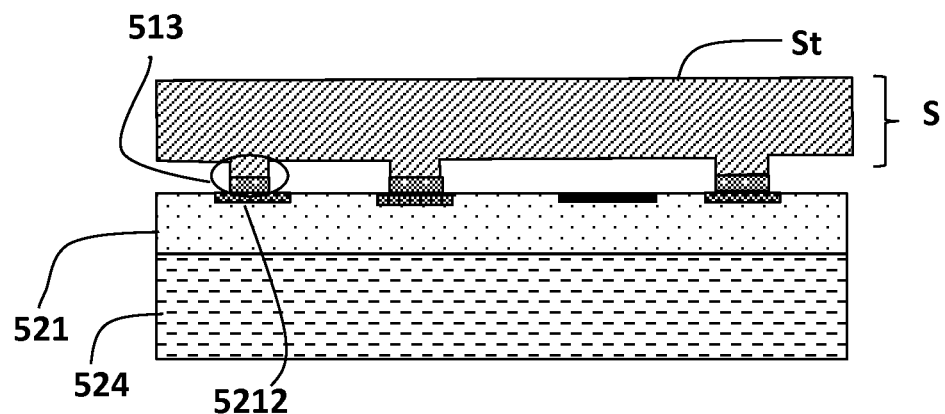

Referring to FIG. 5C, the bonding can be performed after the connection sections 513 of the micro-electro-mechanical device 51 and the connection sections 5212 of the integrated circuit device 52 are disposed at corresponding positions. The aforementioned grinding process on the top surface St of the structure layer S for example can be performed in or after the step of FIG. 5B or 5C. If necessary, the connection section 5212 can be cleaned in advance or coated with a coating such as TiN.

Figure 5D:
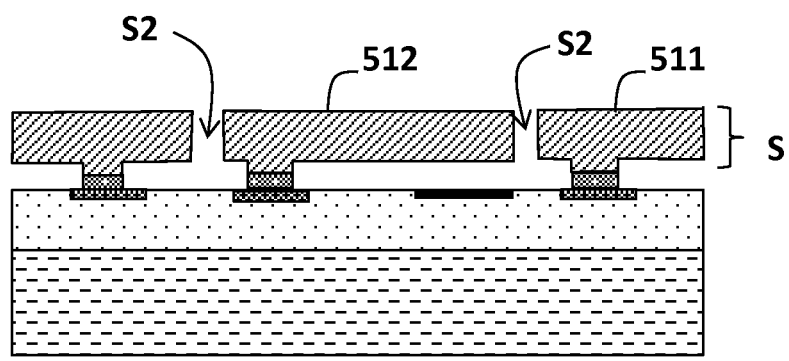

Referring to FIG. 5D, a portion (regions S2) of the structure layer S is removed for example by dry etching or wet etching, to form a least one movable structure 512 and a connection region 511 for connection to the cap 514.

Figure 5E:
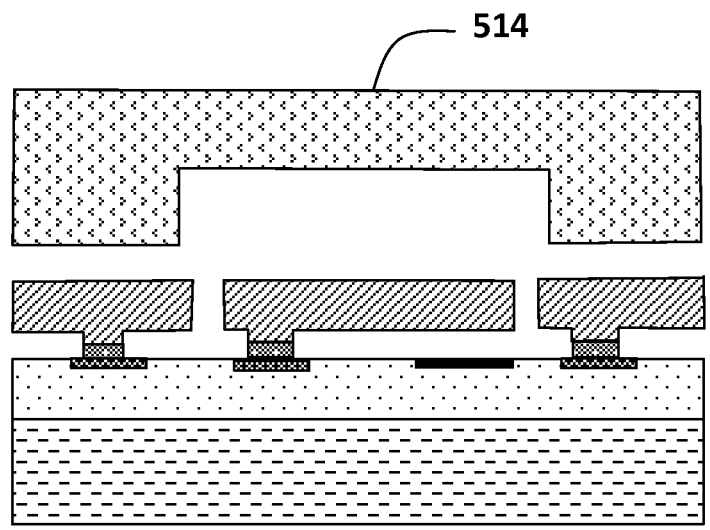
Figure 5F:
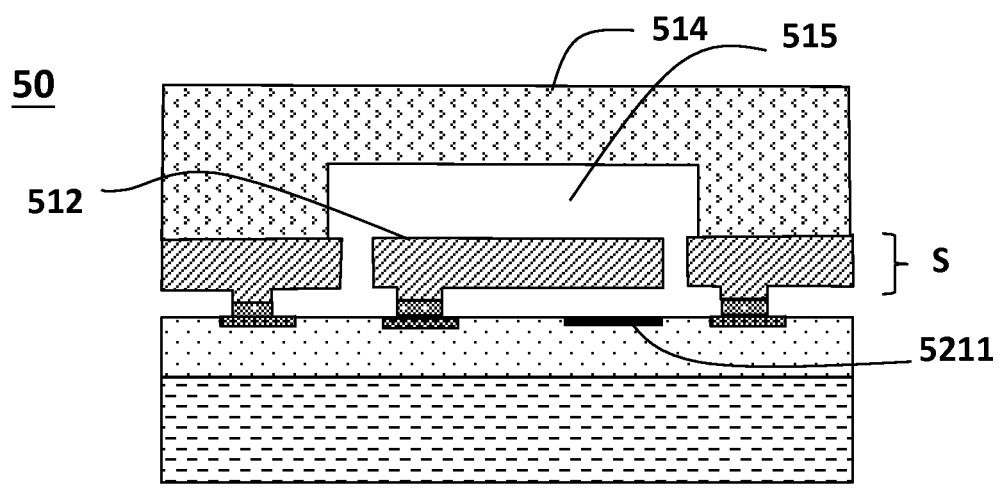

Referring to FIG. 5E, a cap 514 is provided which has been etched to form a recess in order to provide the working space 515 in a later step. Referring to FIG. 5F, the cap 514 is bonded to the connection region 511 to cover the movable structure 512 and the sensing region 5211, thus completing the MEMS device 50. The sensing region 5211 can sense the motion of the movable structure to generate the sensing signal.

Figure 7:
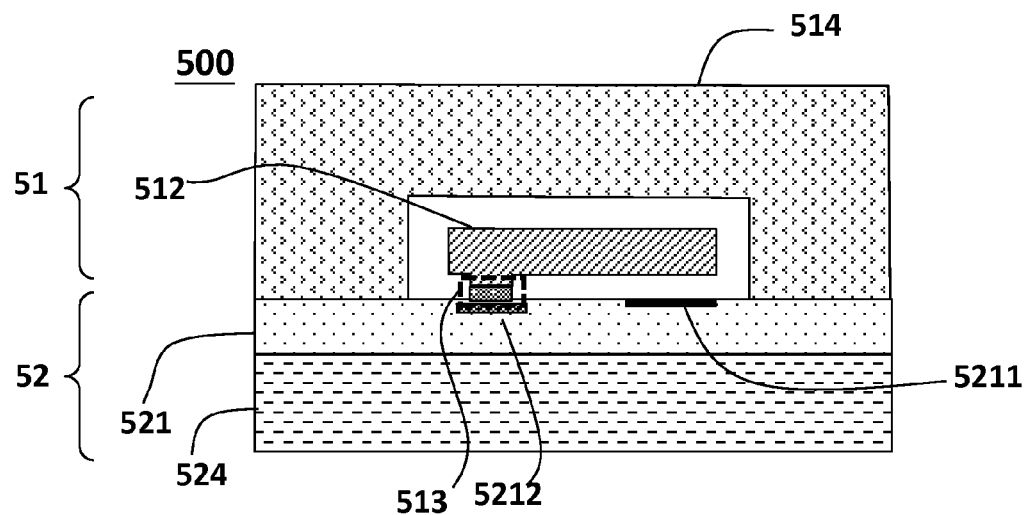
FIG. 7 shows a MEMS device according to another embodiment of the present invention.

The MEMS device according to the present invention is not limited to the structure as shown in FIG. 6. By simple modification of the manufacturing process as shown in FIGS. 5A-5F, MEMS devices with different structures can be manufactured; for example, the MEMS device 500 of FIG. 7 can be manufactured which is different from the MEMS device 50 of FIG. 6 in that different etched regions S2 are defined in the etching step of FIG. 5D, and the cap 514 is bonded to the integrated circuit device 52 instead of the connection region 511 in the step of FIG. 5F.

Figure 8:
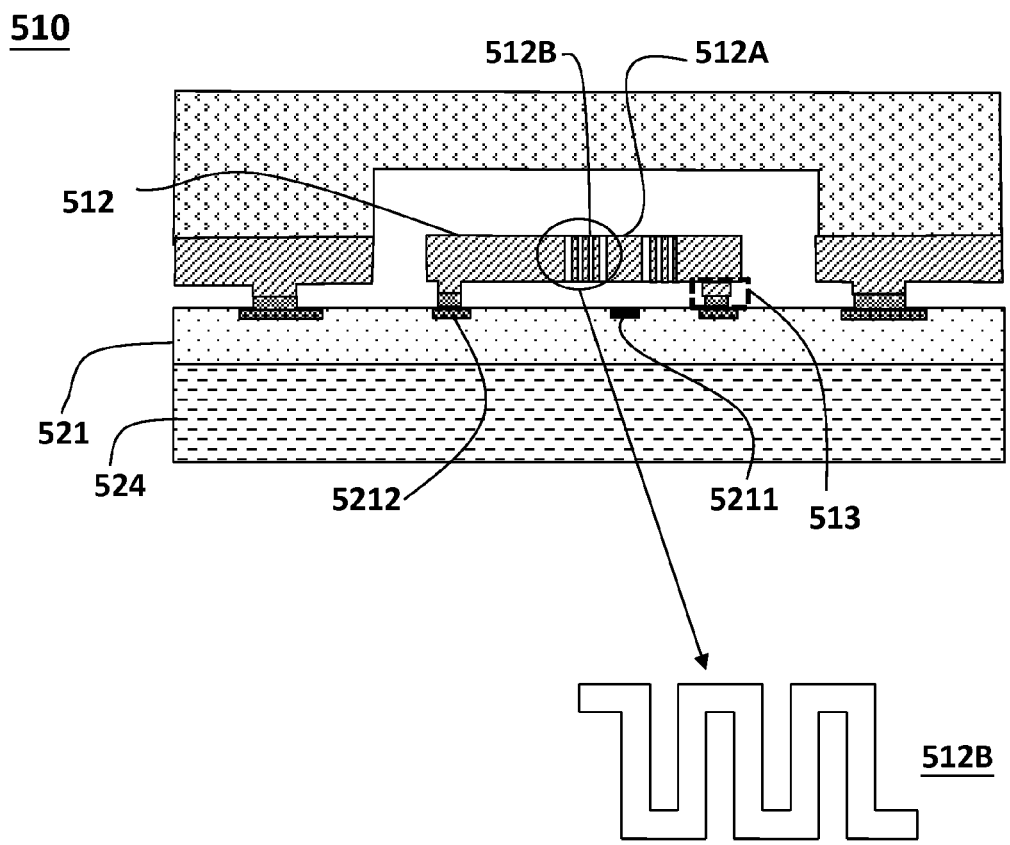
FIG. 8 shows a MEMS device according to yet another embodiment of the present invention.

FIG. 8 shows a MEMS device 510 according to another embodiment of the present invention. The movable structures 512 of FIGS. 6 and 7 include a membrane or a cantilever beam, while the movable structure 512 of FIG. 8 includes a proof mass 512A with at least one spring 512B connected to the proof mass 512A, and the sensing region 5211 is located in correspondence to the proof mass 512A. The spring 512B for example can have but not limited to a planar S-shape (referring to the enlarged top view below), and certainly can have any shape other than this planar S-shape. In FIG. 8, the proof mass 512A is connected to the rest portion of the movable structure 512 via the spring 512B, and the rest portion of the movable structure 512 is connected to the connection region 5212 via the connection section 513.

The cap 514 can include one of the followings: silicon substrate, glass substrate, SiGe substrate, SiC substrate, GaAs substrate, or polymer substrate. The substrate 524 can include one of the followings: silicon substrate, glass substrate, SiGe substrate, SiC substrate, GaAs substrate, or a polymer substrate. The "polymer substrate" includes for example but not limited to PDMS substrate.

The advantages of the present invention at least include: in comparison with the prior art two-chip solution, the present invention has a smaller MEMS device size by eliminating the region of bond pads connecting micro-electro-mechanical device chip 11 and an integrated IC chip 12, and the sensing performance of the present invention is not influenced by the wire-bond. In comparison with the prior art CMOS-MEMS solution, the manufacturing process of the present invention is less complicated; the stress during manufacturing the integrated circuit device will not cause distortion of the movable structure, while the steps of manufacturing the micro-electro-mechanical device will not damage the electrical structure of the integrated circuit device. In comparison with the wafer level integration solution, the MEMS device of the present invention has the same size as the prior art but a more accurate sensing performance than the prior art, because the sensing accuracy of the movable structure is not influenced when the cap is stressed.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention; for example, the stand-offs and the connection sections can be interchanged. That is, the stand-offs can be located on the integrated circuit device side and the connection sections can be located on micro-electro-mechanical device side. Besides, a component which does not affect the primary function of the devices can be inserted between two components shown to be in direct connection in the figures, or a step can be inserted between two sequential steps in the disclosed manufacturing method of the present invention. An embodiment or a claim of the present invention does not need to attain or include all the objectives, advantages or features described in the above. The abstract and the title are provided for assisting searches and not to be read as limitations to the scope of the present invention.

What is claimed is:

1. A manufacturing method of micro-electro-mechanical system (MEMS) device, comprising:
    providing an integrated circuit device including a substrate and an electrical structure on the substrate, wherein the electrical structure includes at least one first connection section;
    providing a structure layer, and forming at least one second connection section on the structure layer;
    bonding the at least one first connection section with the at least one second connection section and forming an electrical connection between the at least one first connection section with the at least one second connection section when the at least one first connection section with the at least one second connection section are bonded;
    etching the structure layer to form at least one movable structure and the movable structure being connected to the at least one first connection section via the at least one second connection section, the movable structure being electrically connected to the integrated circuit device via the at least one first connection section and the at least one second connection section; and
    thereafter, providing a cap to cover the movable structure and the sensing region;
    wherein the movable structure is not directly connected to the cap.

2. The manufacturing method of claim 1, wherein the cap is connected to the electrical structure or a portion of the structure layer which is not the movable structure.

3. The manufacturing method of claim 1, wherein the first connection section and the second connection section are connected by eutectic bonding, solder bonding, thermocompression or fusion.

4. The manufacturing method of claim 3, wherein the step of forming at least one second connection section on the structure layer comprises: etching the structure layer to form at least one stand-off and coating an adhesive on the stand-off.

5. The manufacturing method of claim 4, wherein the adhesive comprises: aluminum, titanium, germanium, gold, tin, or a mixture of two or more of the above elements, or a compound containing one of the above elements.

6. The manufacturing method of claim 1, wherein the movable structure is a membrane or a cantilever beam, or includes a proof mass and a spring connected to the proof mass.

7. The manufacturing method of claim 1, further comprising: grinding the structure layer to reduce a thickness of the structure layer.

8. The manufacturing method of claim 1, further comprising: etching the cap to form a recess for forming a working space in the MEMS device.

9. The manufacturing method of claim 1, wherein the cap includes one of the followings: silicon substrate, glass substrate, SiGe substrate, SiC substrate, GaAs substrate, or polymer substrate.

10. The manufacturing method of claim 1, wherein the substrate includes one of the followings: silicon substrate, glass substrate, SiGe substrate, SiC substrate, GaAs substrate, or polymer substrate.

\* \* \* \* \*